United States Patent
Abe et al.

(10) Patent No.: US 10,325,920 B2
(45) Date of Patent: Jun. 18, 2019

(54) METHOD FOR MANUFACTURING SEMICONDUCTOR DEVICE

(71) Applicant: TOSHIBA MEMORY CORPORATION, Minato-ku (JP)

(72) Inventors: Chihiro Abe, Yokkaichi (JP); Keisuke Kikutani, Yokkaichi (JP); Katsumi Yamamoto, Yokkaichi (JP); Tomoya Oori, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/350,268

(22) Filed: Nov. 14, 2016

(65) Prior Publication Data

US 2017/0330890 A1    Nov. 16, 2017

Related U.S. Application Data

(60) Provisional application No. 62/336,283, filed on May 13, 2016.

(51) Int. Cl.
*H01L 27/11556* (2017.01)
*H01L 27/11521* (2017.01)
*H01L 27/11519* (2017.01)

(52) U.S. Cl.
CPC ... *H01L 27/11556* (2013.01); *H01L 27/11519* (2013.01)

(58) Field of Classification Search
None
See application file for complete search history.

(56) References Cited

U.S. PATENT DOCUMENTS

| 5,837,612 A | * | 11/1998 | Ajuria | ............... | H01L 21/31053 |
| | | | | | 438/697 |
| 8,062,940 B2 | | 11/2011 | Ko et al. | | |
| 9,093,642 B2 | | 7/2015 | Okajima | | |
| 2002/0058394 A1 | * | 5/2002 | Holmes | ................... | H01L 28/92 |
| | | | | | 438/398 |

FOREIGN PATENT DOCUMENTS

| JP | 2010-165803 | 7/2010 |
| JP | 2014-56864 | 3/2014 |
| JP | 2014-146776 | 8/2014 |

* cited by examiner

*Primary Examiner* — Bo B Jang
(74) *Attorney, Agent, or Firm* — Oblon, McClelland, Maier & Neustadt, L.L.P.

(57) ABSTRACT

A method for manufacturing a semiconductor device includes forming a first mask layer having a first opening on an underlying layer; forming a first layer in a space where the underlying layer is selectively removed via the first opening; forming a second mask layer on the first mask layer and the first layer, the second mask layer having a second opening crossing the first opening; and selectively removing the first layer at a portion where the first opening and the second opening cross. At least one of the first and second mask layers having openings including the first or second opening, the openings being arranged in the first mask layer along a first direction, and/or being arranged in the second mask layer along a second direction, the first opening crossing the second opening in the first direction, and the second opening crossing the first opening in the second direction.

18 Claims, 17 Drawing Sheets

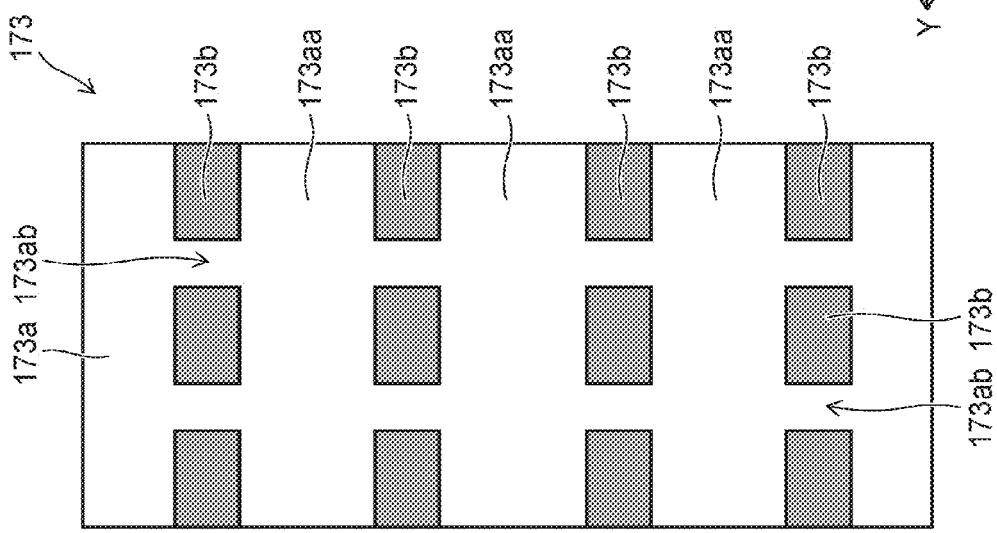
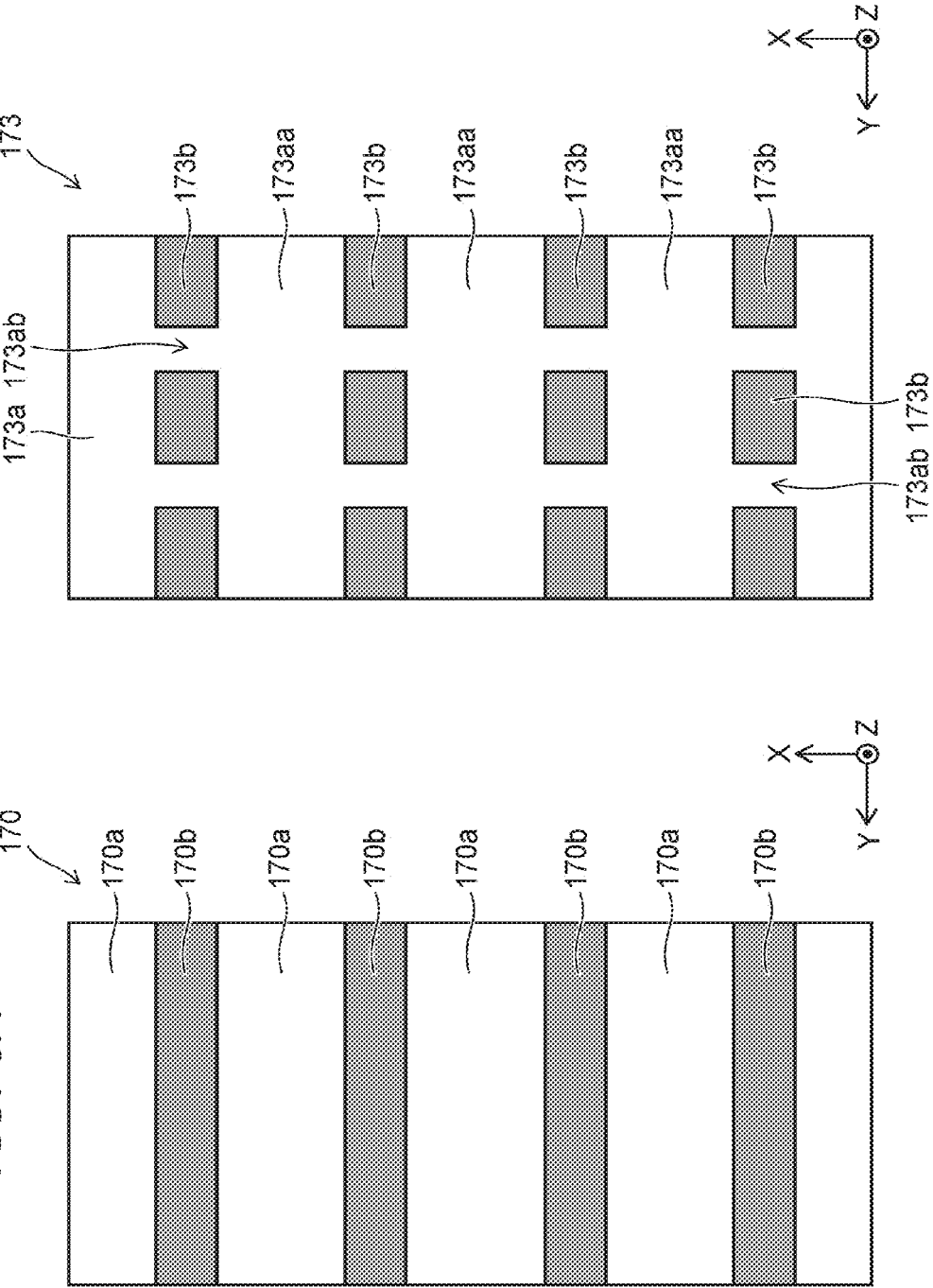

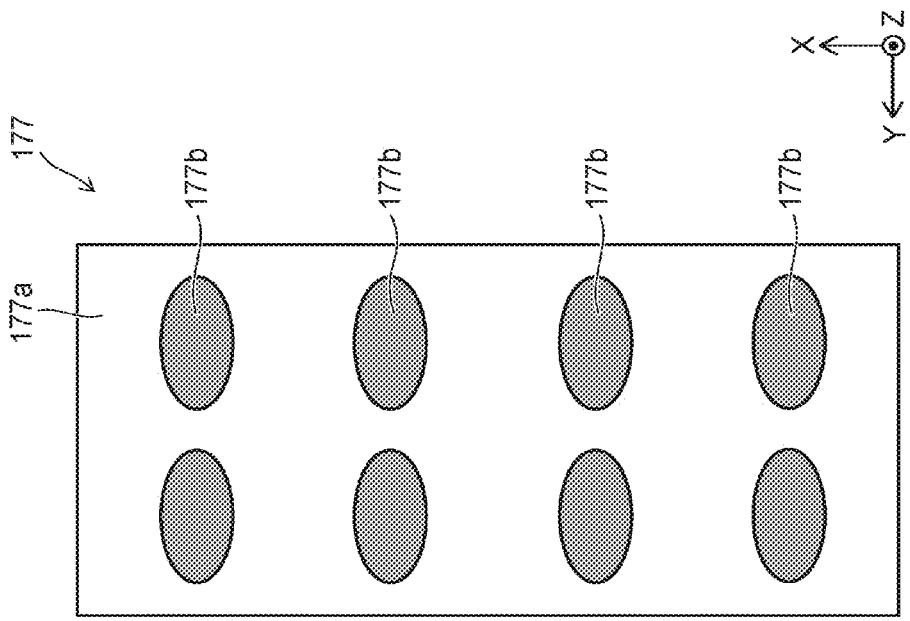
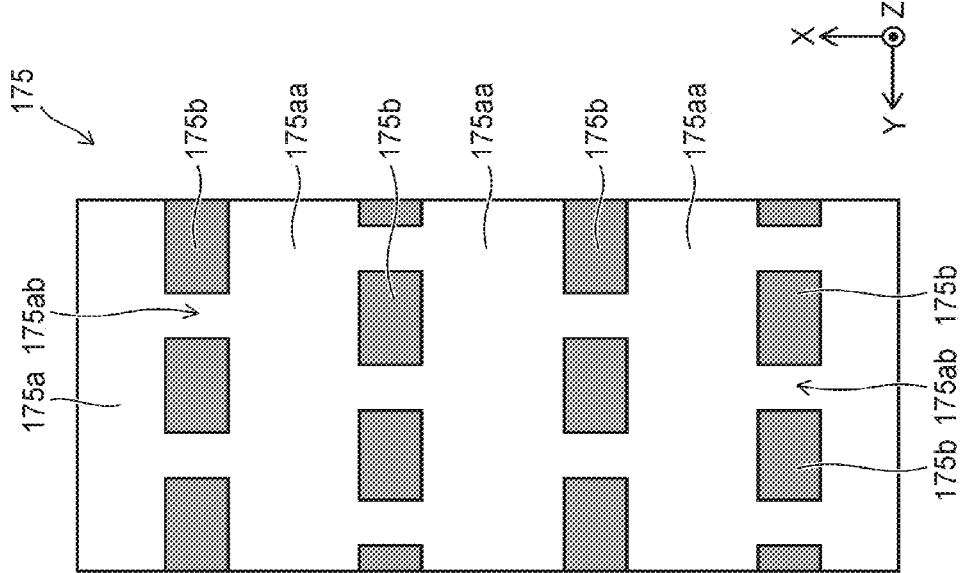

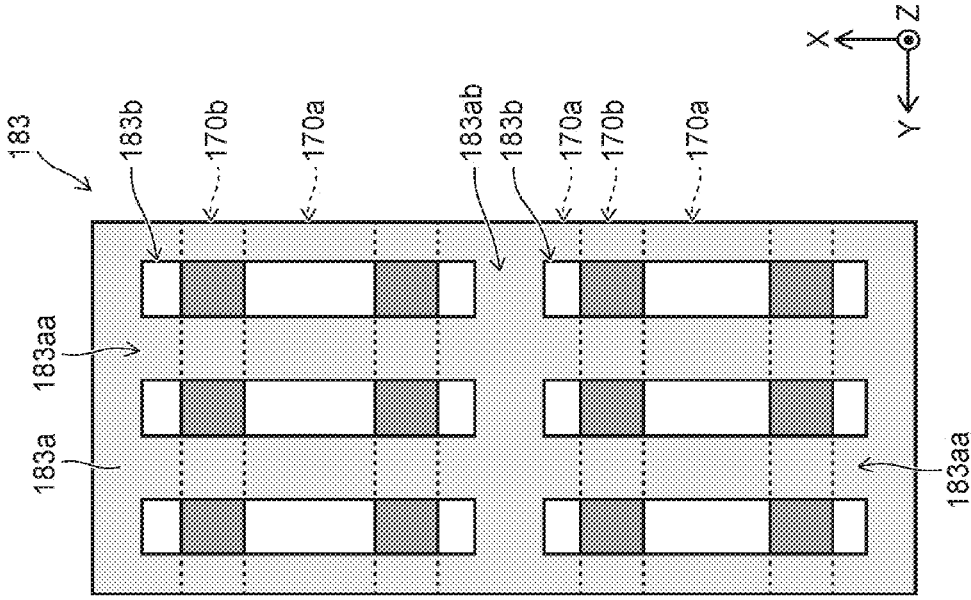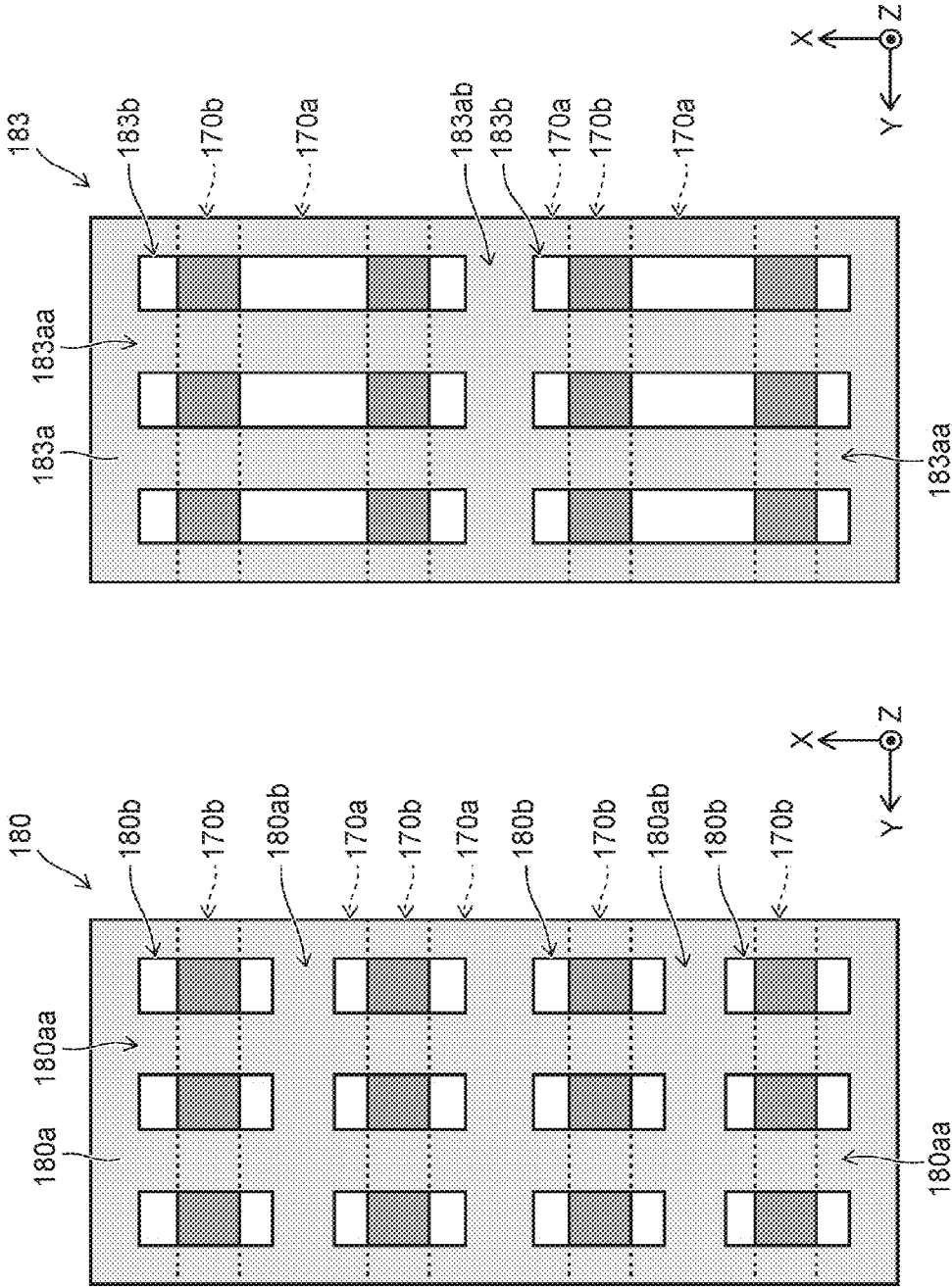

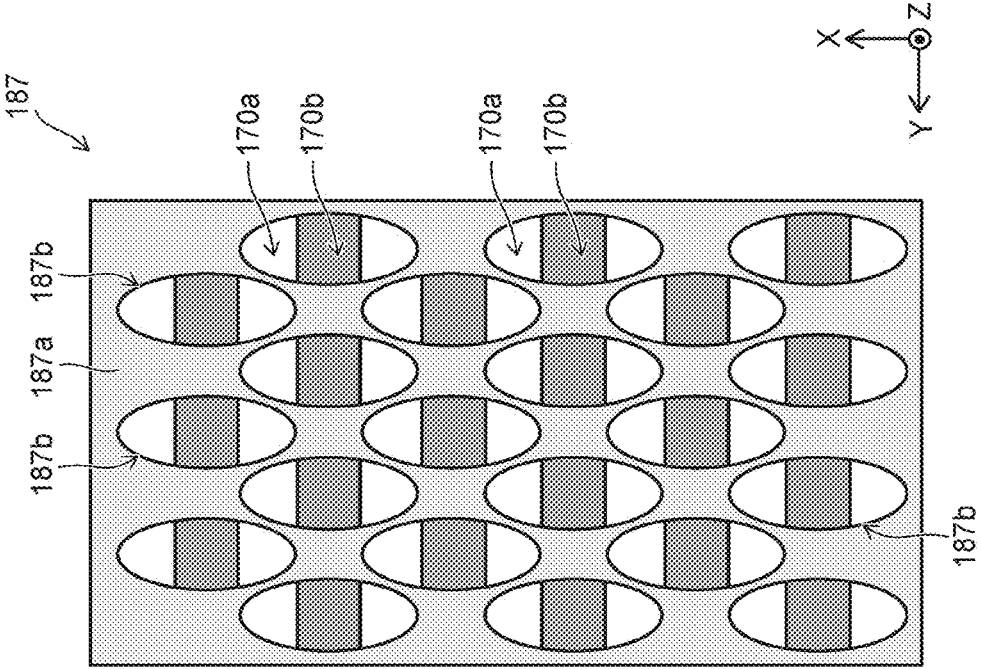
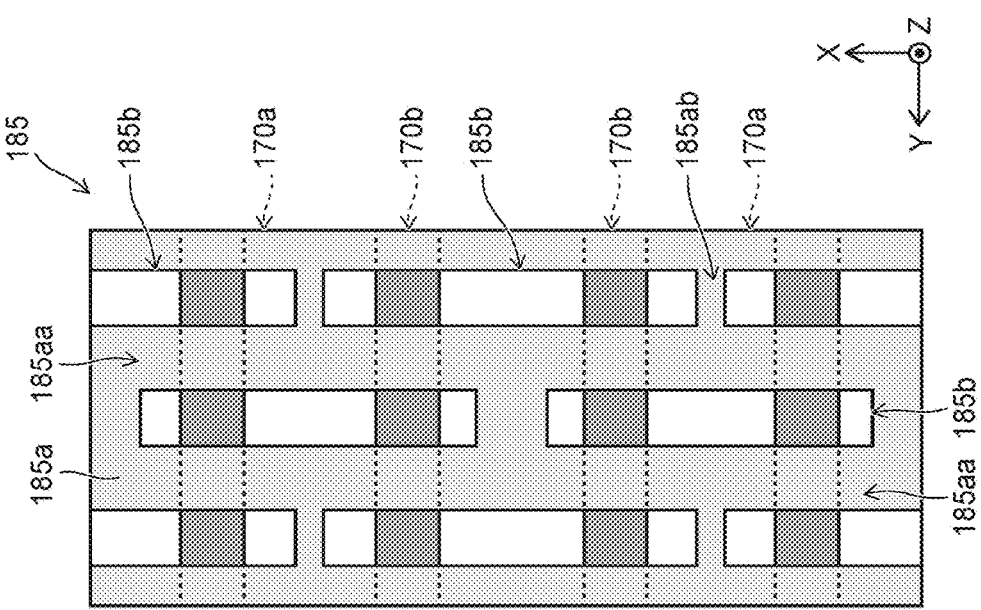

METHOD FOR MANUFACTURING SEMICONDUCTOR DEVICE

CROSS-REFERENCE TO RELATED APPLICATIONS

This application is based upon and claims the benefit of priority from U.S. Provisional Patent Application 62/336,283 filed on May 13, 2016; the entire contents of which are incorporated herein by reference.

FIELD

Embodiments are generally related to a method for manufacturing a semiconductor device.

BACKGROUND

A NAND semiconductor memory device, which includes three-dimensionally arranged memory cells, includes a stacked body including multiple electrode layers stacked on a substrate, and a semiconductor channel extending through the stacked body. In such a semiconductor memory device, the memory capacity thereof can be increased by downscaling the two dimensional structure parallel to the substrate surface and increasing the number of stacks of the multiple electrode layers in the stacked body. However, fine patterning of the stacked body becomes difficult as the number of stacks increases.

BRIEF DESCRIPTION OF THE DRAWINGS

FIGS. 6A to 6D are schematic plan views showing mask patterns of a first mask according to the embodiments; and FIGS. 7A to 7D are schematic plan views showing mask patterns of a second mask according to the embodiments.

DETAILED DESCRIPTION

Figure 1:
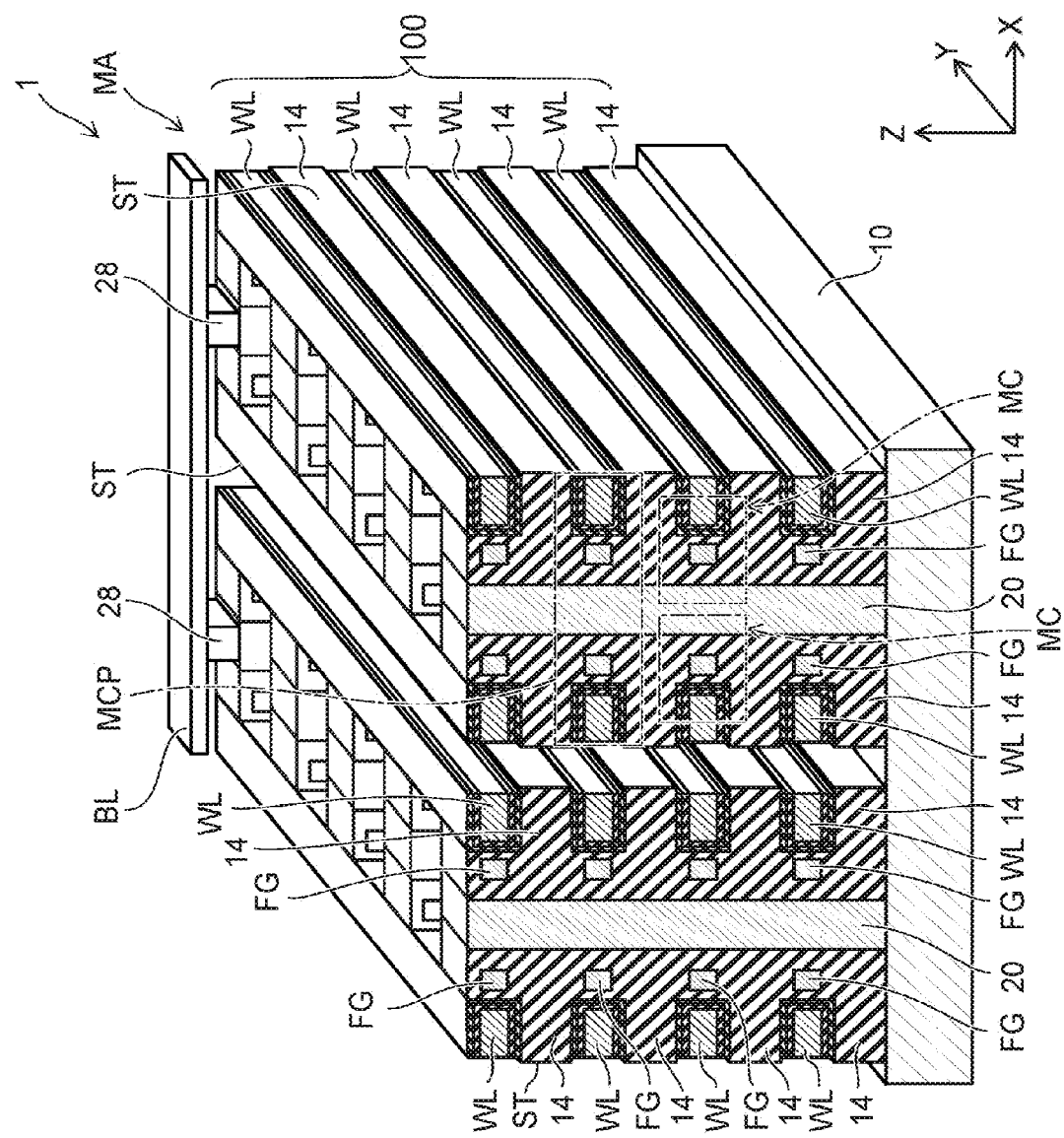
FIG. 1 is a schematic perspective view showing a semiconductor device according to a first embodiment.

According to one embodiment, a method for manufacturing a semiconductor device includes forming a first mask layer on an underlying layer, the first mask layer having a first shielding portion and a first opening; forming a first layer in a space where the underlying layer is selectively removed via the first opening; forming a second mask layer on the first mask layer and on the first layer, the second mask layer having a second shielding portion and a second opening, the second opening crossing the first opening; and selectively removing the first layer at a portion where the first opening and the second opening cross. At least one of the first mask layer and the second mask layer having a plurality of openings including the first opening or the second opening, the plurality of openings being arranged in the first mask layer along a first direction, and/or being arranged in the second mask layer along a second direction, the first opening crossing the second opening in the first direction, and the second opening crossing the first opening in the second direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

A semiconductor device 1 according to an embodiment is, for example, a NAND nonvolatile memory device. FIG. 1 is a perspective view schematically showing a memory cell array MA of the semiconductor device 1. The memory cell array MA includes multiple memory cells MC, which are three-dimensionally arranged.

As shown in FIG. 1, the memory cell array MA includes a conductive layer 10, multiple stacked bodies 100, and a bit line BL. The conductive layer 10 is, for example, a silicon layer. The multiple stacked bodies 100 are disposed on the conductive layer 10 such as being arranged in an X-direction. For example, the multiple stacked bodies 100 have a structure divided by a slit ST extending in a Y-direction. The bit line BL is provided above the stacked bodies 100 and extends in, for example, the X-direction. To illustrate the structure of the memory cell array MA in FIG. 1, insulating layers are omitted, which are provided between the bit line BL and the stacked bodies 100 and between the mutually-adjacent stacked bodies 100.

The stacked body 100 includes multiple word lines WL, multiple insulating layers 14, and semiconductor layers 20. The word lines WL are stacked in a Z-direction with the insulating layers 14 interposed. Also, the word lines WL extend in the Y-direction and are disposed to be arranged in the X-direction. The word lines WL include, for example, a conductive material such as tungsten, etc. The insulating layers 14 include, for example, silicon oxide. The semiconductor layers 20 extend in the Z-direction through the stacked body 100. The semiconductor layers 20 are positioned between the word lines WL arranged in the X-direction.

The memory cell array MA further includes floating gates FG provided between a semiconductor layer 20 and the word lines WL. The floating gates FG function as charge retaining portions of the memory cells MC provided along the semiconductor layer 20. The lower end of the semiconductor layer 20 is electrically connected to the conductive layer 10; and the upper end of the semiconductor layer 20 is electrically connected to the bit line BL via a contact plug 28. The semiconductor layer 20 is, for example, a silicon layer and functions as channels of the memory cells MC.

Figure 2A:
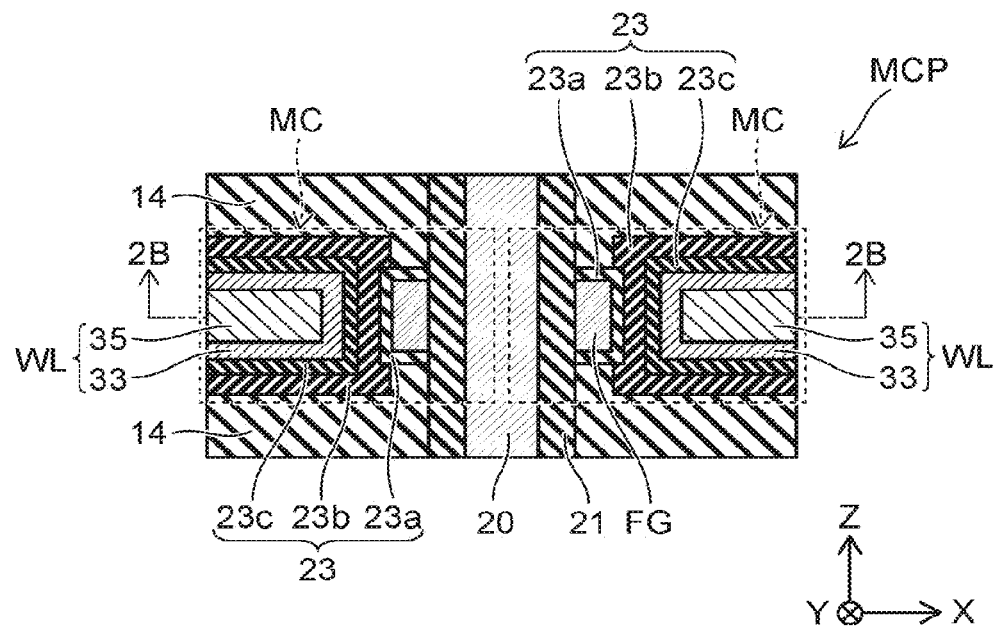
FIGS. 2A and 2B are schematic cross-sectional views showing the semiconductor device according to the first embodiment.
Figure 2B:
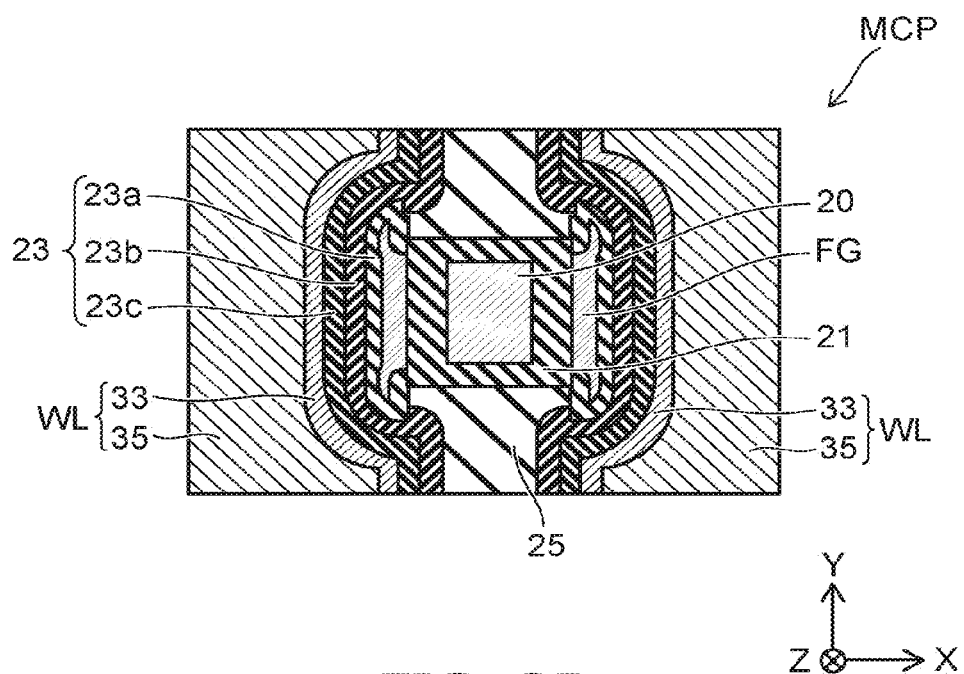

FIGS. 2A and 2B are schematic cross-sectional views showing a memory cell part MCP of the semiconductor device 1 according to the embodiment. FIG. 2A is a schematic cross-sectional view of the memory cell part MCP shown by a broken line in FIG. 1. FIG. 2B is a schematic cross-sectional view along line 2B-2B in FIG. 2A.

As shown in FIG. 2A, the floating gates FG are provided between the semiconductor layer 20 and the word lines WL. Also, a tunneling insulating layer 21 is provided between the semiconductor layer 20 and the floating gates FG; and a blocking insulating layer 23 is provided between the floating gate FG and each of the word lines WL.

The tunneling insulating layer 21 is, for example, a silicon oxide layer and is provided to have a thickness making it possible to inject charge from the semiconductor layer 20 into the floating gates FG. As shown in FIG. 2B, the tunneling insulating layer 21 is provided to surround the semiconductor layer 20.

The blocking insulating layer 23 blocks the charges moving toward the word line WL from the floating gate FG. For example, the blocking insulating layer 23 has a stacked structure including a first layer 23a, a second layer 23b and a third layer 23c. The first layer 23a is provided between the floating gate FG and the second layer 23b and includes, for example, a high dielectric constant material such as hafnium oxide, aluminum oxide, etc. The second layer 23b is provided between the first layer 23a and the third layer 23c and includes, for example, silicon oxide. The third layer 23c is provided between the second layer 23b and the word line WL and includes, for example, a high dielectric constant material such as hafnium oxide, aluminum oxide, etc.

The word line WL includes, for example, a barrier metal layer 33 and a core metal layer 35. The barrier metal layer 33 is provided between the blocking insulating layer 23 and the core metal layer 35 and includes, for example, titanium or titanium nitride. The core metal layer 35 includes, for example, a high melting point metal such as tungsten, etc.

As shown in FIG. 2B, an insulating layer 25 is provided between the semiconductor layers 20 adjacent to each other in the Y-direction. The insulating layer 25 is, for example, a silicon oxide layer. For example, the insulating layer 25 is provided in a trench extending through the stacked body 100 in the Z-direction.

A method for manufacturing the semiconductor device 1 according to the embodiment will now be described with reference to FIGS. 3A to 3K. FIGS. 3A to 3K are schematic views showing some of the manufacturing processes of the semiconductor device 1 according to the embodiment. FIGS. 3A to 3C, 3E, 3F, 3H, and 3J are perspective views schematically showing a portion corresponding to the memory cell array MA; and FIGS. 3D, 3G, 3I, and 3K are schematic plan views showing the upper surface of the portion corresponding to the memory cell array MA.

Figure 3A:
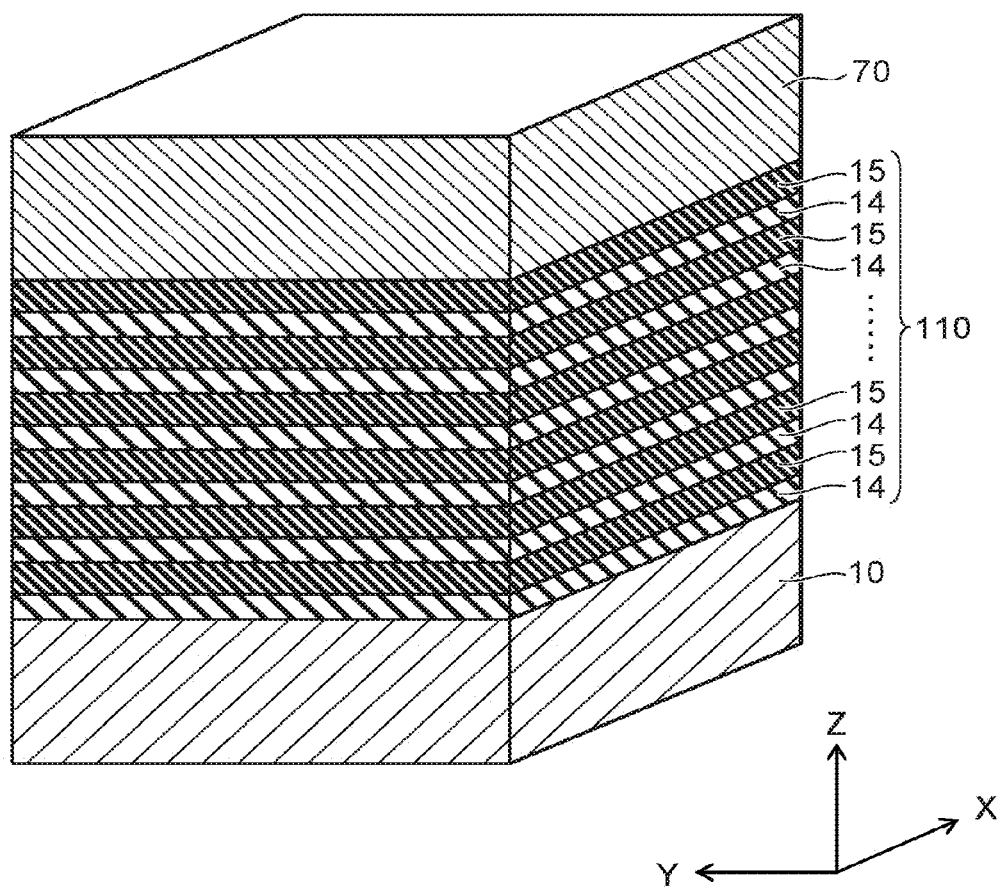
FIGS. 3A to 3K are schematic views showing a manufacturing process of the semiconductor device according to the first embodiment.

As shown in FIG. 3A, a stacked body 110 is formed on the conductive layer 10. The stacked body 110 includes the insulating layers 14 and insulating layers 15 stacked alternately in the Z-direction. The insulating layers 15 include a material having a faster etching rate than an etching rate of the insulating layers 14 for prescribed etching conditions. The insulating layers 14 are, for example, silicon oxide layers; and the insulating layers 15 are, for example, silicon nitride layers.

Further, a first mask layer 70 is formed on the stacked body 110. The first mask layer 70 is, for example, an amorphous silicon layer formed using CVD (Chemical Vapor Deposition).

Figure 3B:
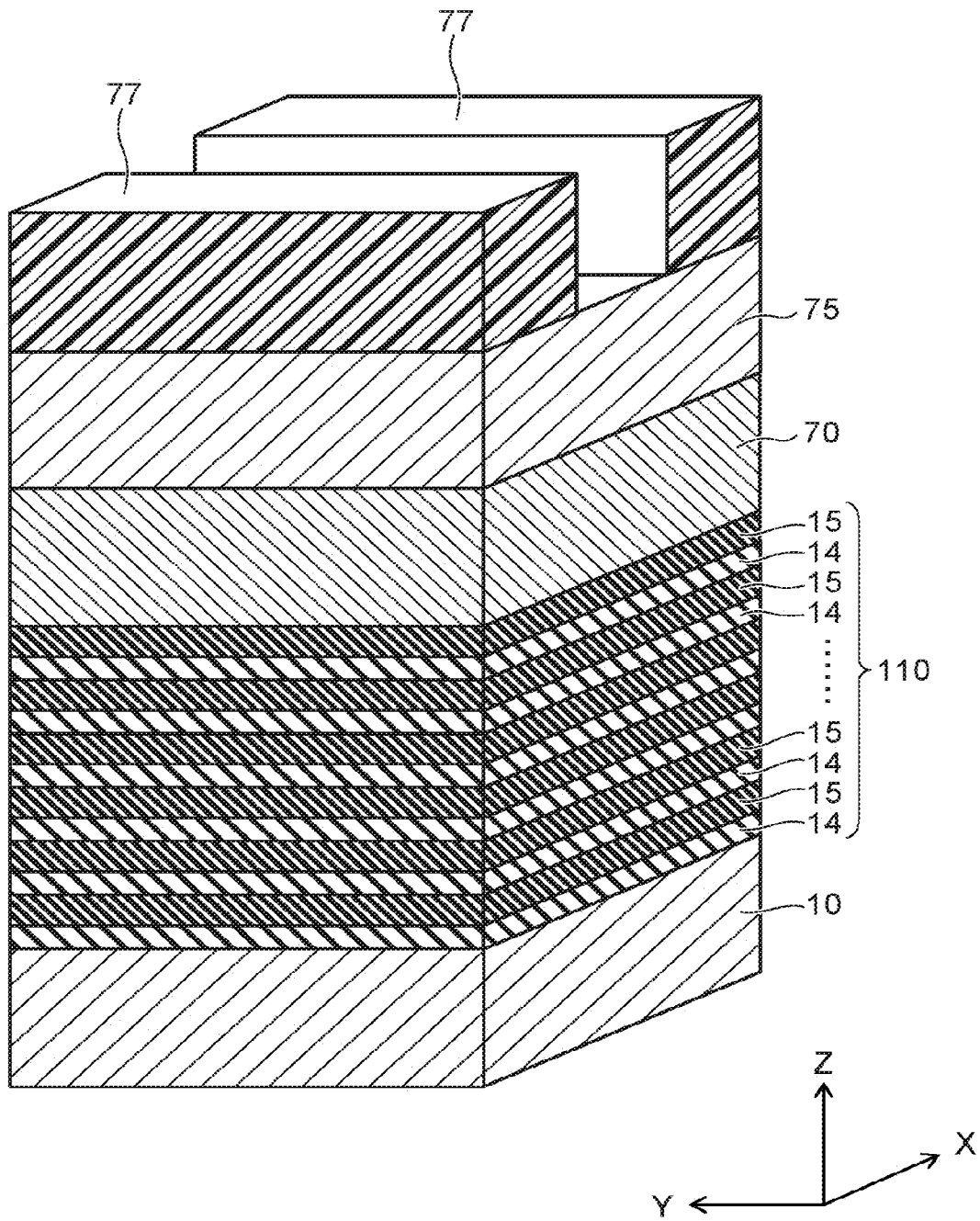

As shown in FIG. 3B, a hard mask layer 75 and a resist mask 77 are formed on the first mask layer 70. The hard mask layer 75 is, for example, a silicon oxide layer formed using CVD. For example, the resist mask 77 is formed in multiple stripe configurations extending in the Y-direction and being disposed to be arranged in the X-direction. For example, the resist mask 77 is formed using photolithography.

Figure 3C:
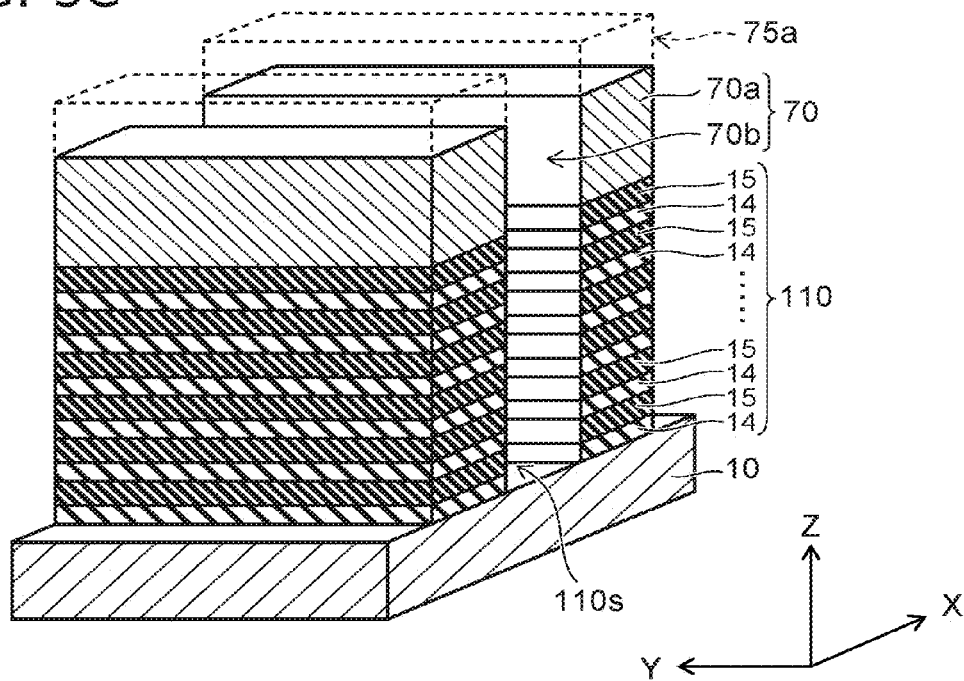

Then, the hard mask layer 75 is selectively removed using the resist mask 77; and a shielding portion 75a that has a stripe configuration is formed on the first mask layer 70 as shown in FIG. 3C. Further, a shielding portion 70a and an opening 70b are formed by selectively removing the first mask layer 70 by using the shielding portion 75a as an etching mask. Subsequently, a space 110s is formed in the stacked body 110 by selectively removing the insulating layers 14 and 15 via the opening 70b.

For example, the hard mask layer 75 and the first mask layer 70 are etched using anisotropic RIE (Reactive Ion Etching). For example, the resist mask 77 may be removed in the process of etching the first mask layer 70; and the shielding portion 75a of the hard mask layer 75 may be removed in the process of etching the insulating layers 14 and 15.

Figure 3D:
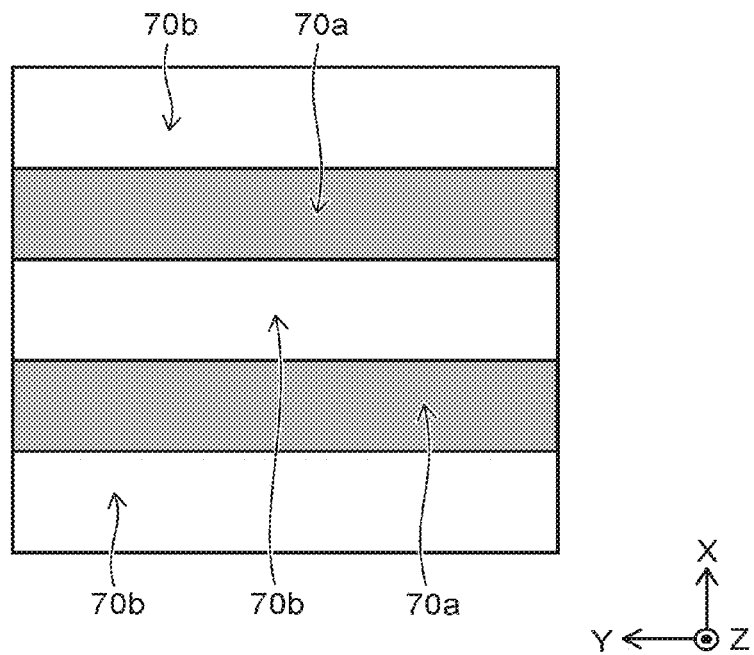

As shown in FIG. 3D, the first mask layer 70 has the shielding portion 70a and the opening 70b in the process of etching the insulating layers 14 and 15. The shielding portion 70a and the opening 70b extend in the Y-direction and are arranged alternately in the X-direction.

Figure 3E:
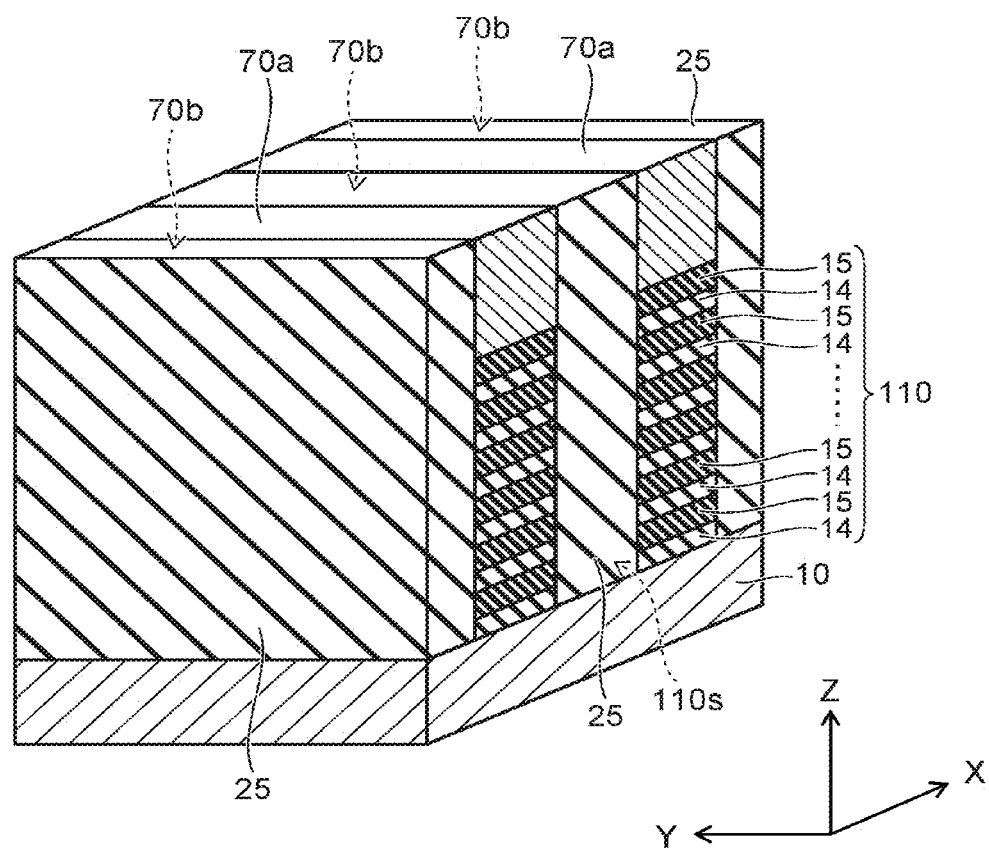

As shown in FIG. 3E, the insulating layer 25 is formed in the space 110s of the stacked body 110. The insulating layer 25 is formed by coating a coating material including, for example, polysilazane on the stacked body 110 and filling the coating material into the space 110s, and then performing heat treatment of the coating material. The portion of the insulating layer 25 formed on the stacked body 110 is removed by, for example, CDE (Chemical Dry Etching). Thereby, the insulating layer 25 is formed to fill the space 110s of the stacked body 110 and the opening 70b of the first mask layer 70.

Figure 3F:
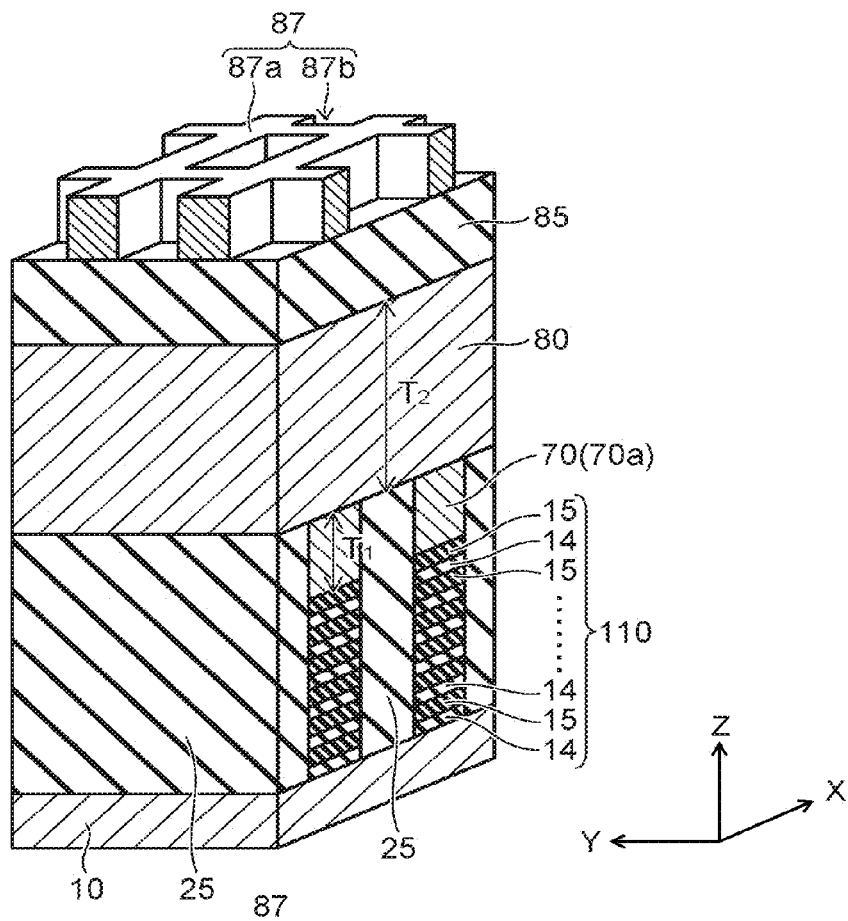

As shown in FIG. 3F, a second mask layer 80, a hard mask layer 85, and a resist mask 87 are formed on the shielding portion 70a of the first mask layer 70 and on the insulating layer 25. The second mask layer 80 is, for example, a carbon layer formed using CVD, and is formed on the shielding portion 70a and the insulating layer 25. The second mask layer 80 is formed to have a thickness $T_2$ in the Z-direction that is thicker than a thickness $T_1$ in the Z-direction of the first mask layer 70.

The hard mask layer 85 is, for example, a silicon oxynitride layer formed using CVD and is formed on the second mask layer 80. Further, the resist mask 87 is formed on the hard mask layer 85. For example, the resist mask 87 is formed using photolithography to include a shielding portion 87a and multiple openings 87b.

Figure 3G:
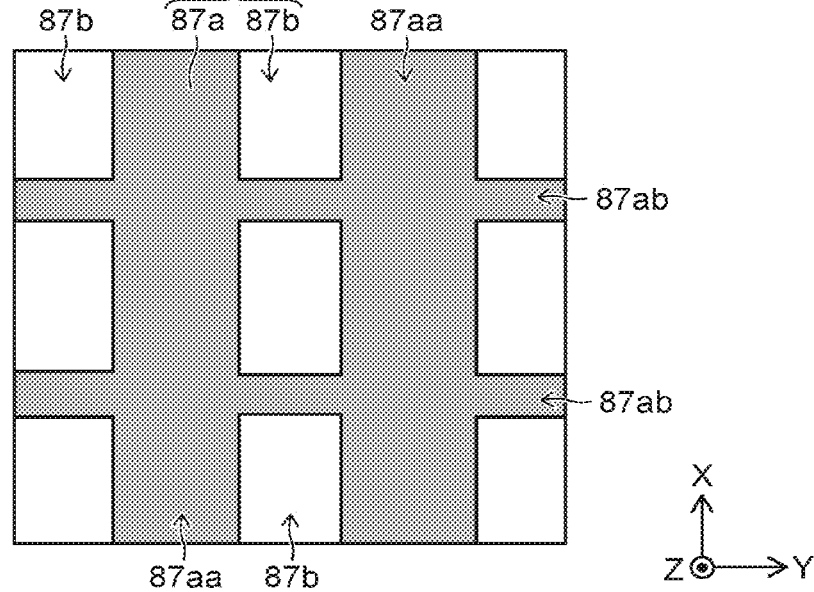

As shown in FIG. 3G, in the resist mask 87, the shielding portion 87a includes multiple first portions 87aa that extend in the X-direction, and multiple second portions 87ab that extend in the Y-direction; and the resist mask 87 has a configuration in which the second portions 87ab cross the first portions 87aa. The openings 87b are arranged in the X-direction between the first portions 87aa adjacent to each other in the Y-direction. The second portions 87*ab* are positioned between the openings 87*b* adjacent to each other in the X-direction.

Figure 3H:
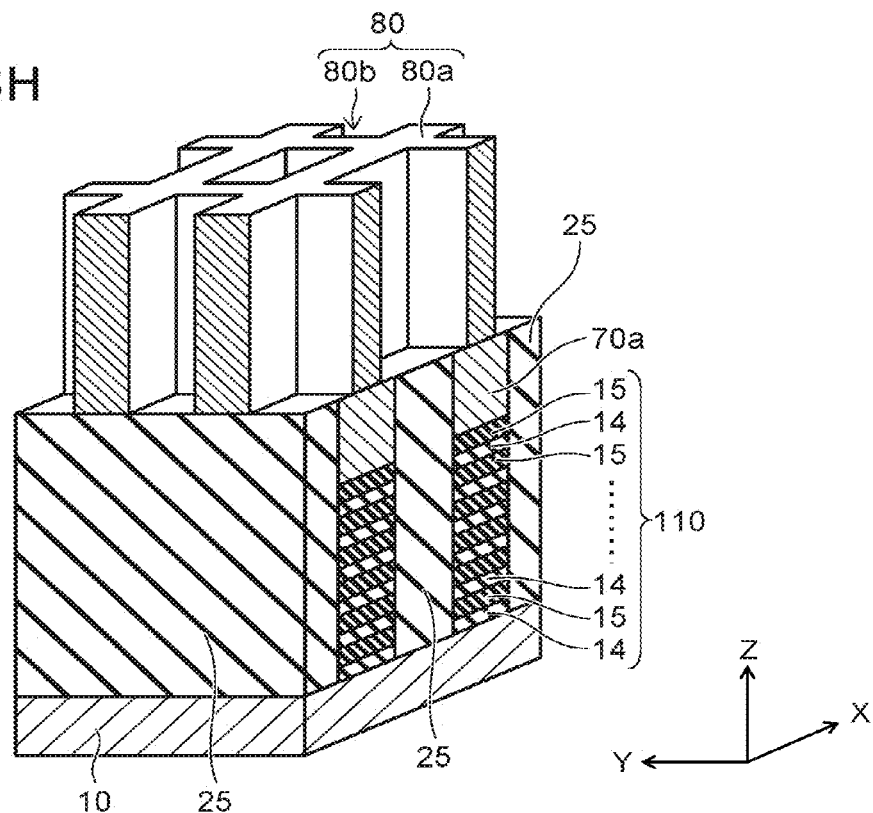

As shown in FIG. 3H, a shielding portion 80*a* and multiple openings 80*b* are formed in the second mask layer 80. For example, the hard mask layer 85 is selectively removed by using the resist mask 87; further, the second mask layer 80 is selectively removed using the hard mask layer 85 as an etching mask (referring to FIG. 3F). For example, the second mask layer 80 and the hard mask layer 85 are etched using anisotropic RIE.

Figure 3I:
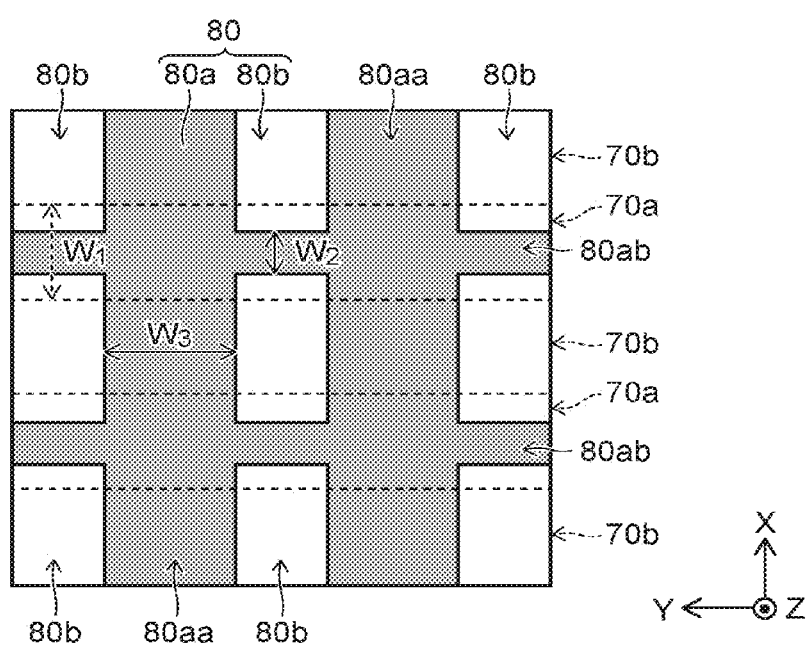

In the second mask layer 80 shown in FIG. 3I, the shielding portion 80*a* includes multiple first portions 80*aa* that extend in the X-direction, and multiple second portions 80*ab* that extend in the Y-direction. The second portions 80*ab* are formed to cross the first portions 80*aa*. The multiple openings 80*b* are formed to be arranged in the X-direction between the mutually-adjacent first portions 80*aa*. The second portions 80*ab* are positioned between the openings 80*b* adjacent to each other in the X-direction.

As shown in FIG. 3I, the second portion 80*ab* of the shielding portion 80*a* is provided at a position overlapping the shielding portion 70*a* of the first mask layer 70 as viewed from the Z-direction. The second portion 80*ab* is formed so that a width $W_2$ of the second portion 80*ab* is narrower than a width $W_1$ of the shielding portion 70*a* of the first mask layer 70. Here, the widths $W_1$ and $W_2$ are defined in the X-direction.

Figure 3J:
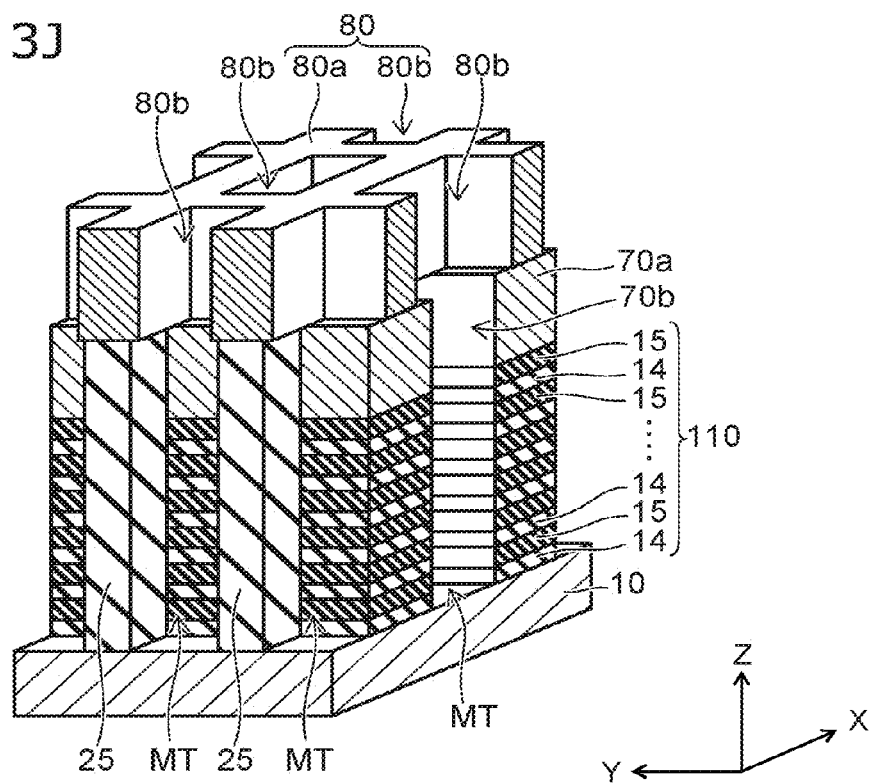

As shown in FIG. 3J, memory trenches MT that communicate with the conductive layer 10 are formed by selectively removing the insulating layer 25 by using the second mask layer 80. For example, the insulating layer 25 is selectively removed using anisotropic RIE.

Figure 3K:
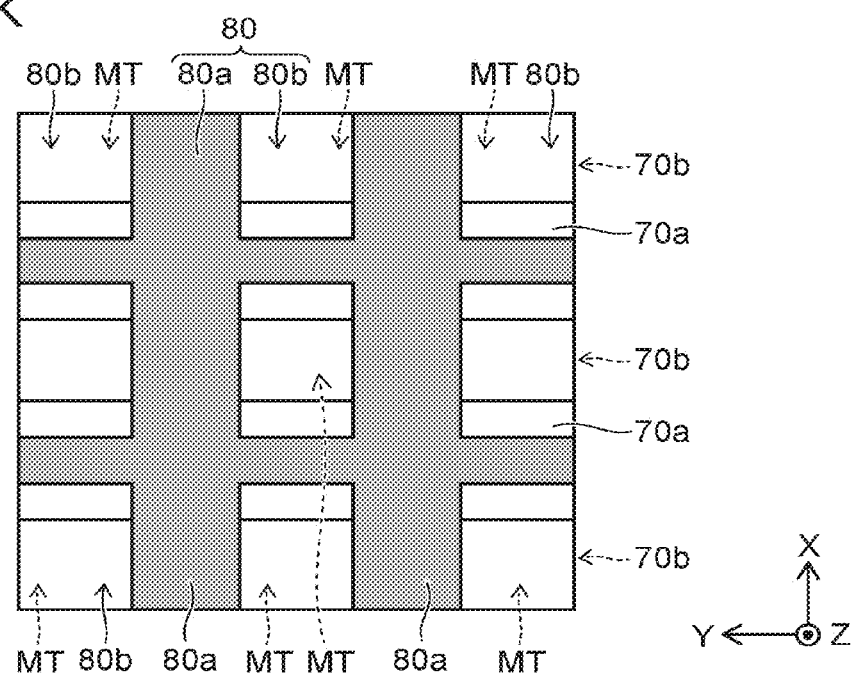

The insulating layer 25 is embedded into the openings 70*b* of the first mask layer 70 (referring to FIG. 3E). Then, the insulating layer 25 is removed via the openings 80*b* of the second mask layer 80. As shown in FIG. 3K, the insulating layer 25 is selectively removed at the portions where the openings 70*b* of the first mask layer 70 and the openings 80*b* of the second mask layer 80 cross. Thus, the memory trenches MT are provided at the portions where the openings 70*b* and the openings 80*b* cross.

Then, portions of the insulating layers 15 exposed at the inner walls of the memory trenches MT are selectively removed; and recesses are formed where the end surfaces of the insulating layers 15 recede. Further, the first layers 23*a* of the blocking insulating layers 23 and the floating gates FG are formed in the recesses, for example, using ALD (Atomic Layer Deposition) and anisotropic RIE (referring to FIG. 2A). Subsequently, the tunneling insulating layers 21 that cover the wall surfaces of the memory trenches MT are formed in the memory trenches MT; further, the semiconductor layers 20 are formed in the memory trenches MT (referring to FIG. 2B). The floating gates FG and the semiconductor layers 20 include, for example, polysilicon.

Subsequently, the slit ST that divides the stacked body 110 in the Y-direction is formed; and the insulating layers 15 are replaced with the second layers 23*b* and the third layers 23*c* of the blocking insulating layers 23 and the word lines WL via the slit ST. Thereby, the stacked bodies 100 are completed. Then, the bit lines BL and an inter-layer insulating layer that covers the stacked bodies 100, the insulating layer 25 and the semiconductor layers 20 are formed; and the memory cell array MA is completed.

For example, in the case where the size of the memory cell MC is shrunk and the number of stacks of the word lines WL is increased to enlarge the memory capacity of the memory cell array MA, the widths of the shielding portions and the openings of the first mask layer 70 and the second mask layer 80 become narrower in the manufacturing processes recited above. Also, the first mask layer 70 and the second mask layer 80 are formed to be thicker enough to perform the etching of the stacked body 110 which has the increased thickness.

Figure 4A:
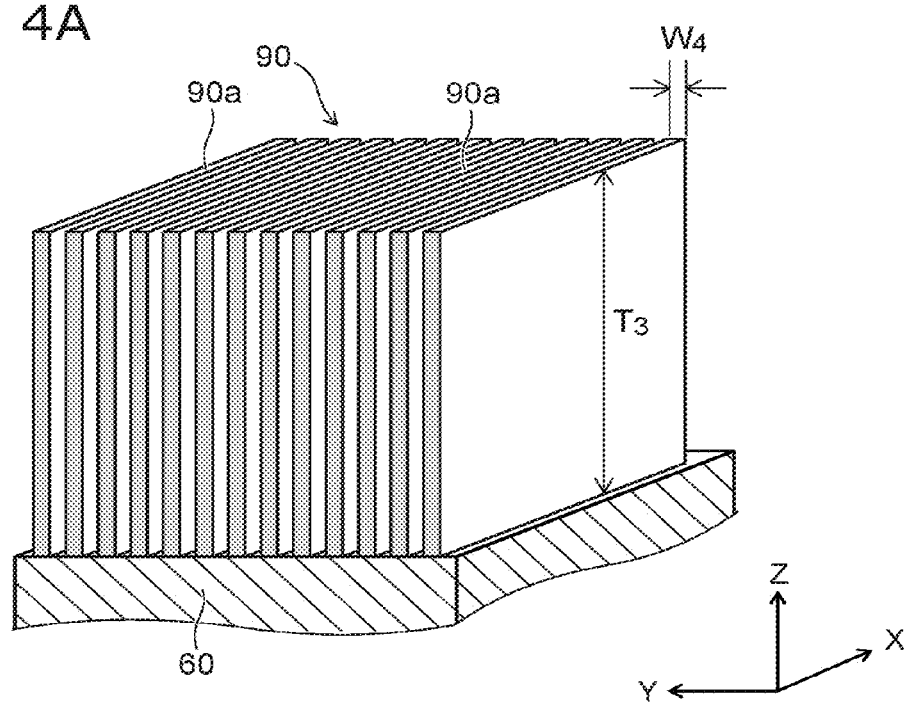
FIG. 4A is a schematic view showing a mask layer according to a comparative example.
Figure 4B:
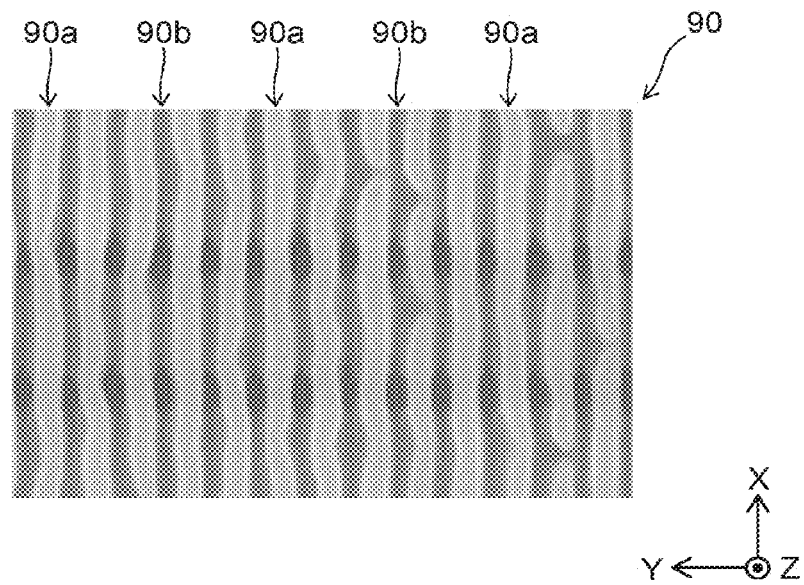
FIG. 4B is a secondary electron microscope image (hereinafter a SEM image) showing the top surface of the mask layer.

FIG. 4A is a perspective view schematically showing a mask layer 90 according to a comparative example. FIG. 4B is a SEM image showing the top surface of the mask layer 90 after etching an underlying layer 60.

As shown in FIG. 4A, the mask layer 90 includes multiple shielding portions 90*a* extending in the X-direction. When a thickness $T_3$ of the mask layer 90 is thicker and a width $W_4$ of the shielding portion 90*a* is narrower, the aspect ratio $(T_3/W_4)$ of the shielding portions 90*a* is larger. As a result, the shielding portions 90*a* are formed in thin plate configurations that spread in the X-direction and the Y-direction.

FIG. 4B shows the top surface of such a mask layer 90 after dry etching of the underlying layer 60 is performed selectively using the mask layer 90. As shown in FIG. 4B, the shielding portions 90*a* are deformed by damage in the etching process. Then, it becomes difficult to maintain the prescribed spacing in openings 90*b* between the shielding portions 90*a*; and the desired etched configuration may no longer be formed in the underlying layer 60. Such deformation of the shielding portions 90*a* becomes pronounced when the aspect ratio exceeds 10, for example.

In contrast, the second mask layer 80 shown in FIG. 3I has the shielding portion 80*a* that includes the first portions 80*aa* and the second portions 80*ab*. For example, the first portions 80*aa* extend in the X-direction; and the second portions 80*ab* extend in the Y-direction to cross the first portions 80*aa*. In other words, the second portions 80*ab* are cross-linking portions that are provided between the mutually-adjacent first portions 80*aa* and improve the etching resistance of the first portions 80*aa*. Thereby, the deformation of the shielding portion 80*a* is suppressed in the process of dry etching; and the configurations of the openings 80*b* can be maintained. As a result, the desired etched configuration may be obtained in the underlying layer, i.e. in the stacked body 110.

For example, the deformation of the shielding portion 80*a* occurs more easily as the length in the X-direction of the opening 80*b* becomes longer. Accordingly, it is desirable for the opening 80*b* to have a length such that no deformation occurs in the shielding portion 80*a*. In other words, it is preferable for the opening 80*b* to have a size capable of maintaining the etching resistance of the shielding portion 80*a*.

Further, the width $W_2$ of the second portion 80*ab* of the shielding portion 80*a* shown in FIG. 3I may be set to be narrower than a width $W_3$ of the first portion 80*aa*. For example, the second mask layer 80 also is etched in the process of dry etching; and the thickness $T_3$ of the second mask layer 80 becomes thinner. Thus, the aspect ratio of the first portion of the shielding portion 80*a* becomes small. Although the second portions 80*ab* may be vanished during the dry etching process due to the width $W_2$ being narrowed, the deformation of the shielding portion 80*a* may be possible to be suppressed by the second portions 80*ab* existing in the initial state of the etching.

Second Embodiment

Figure 5A:
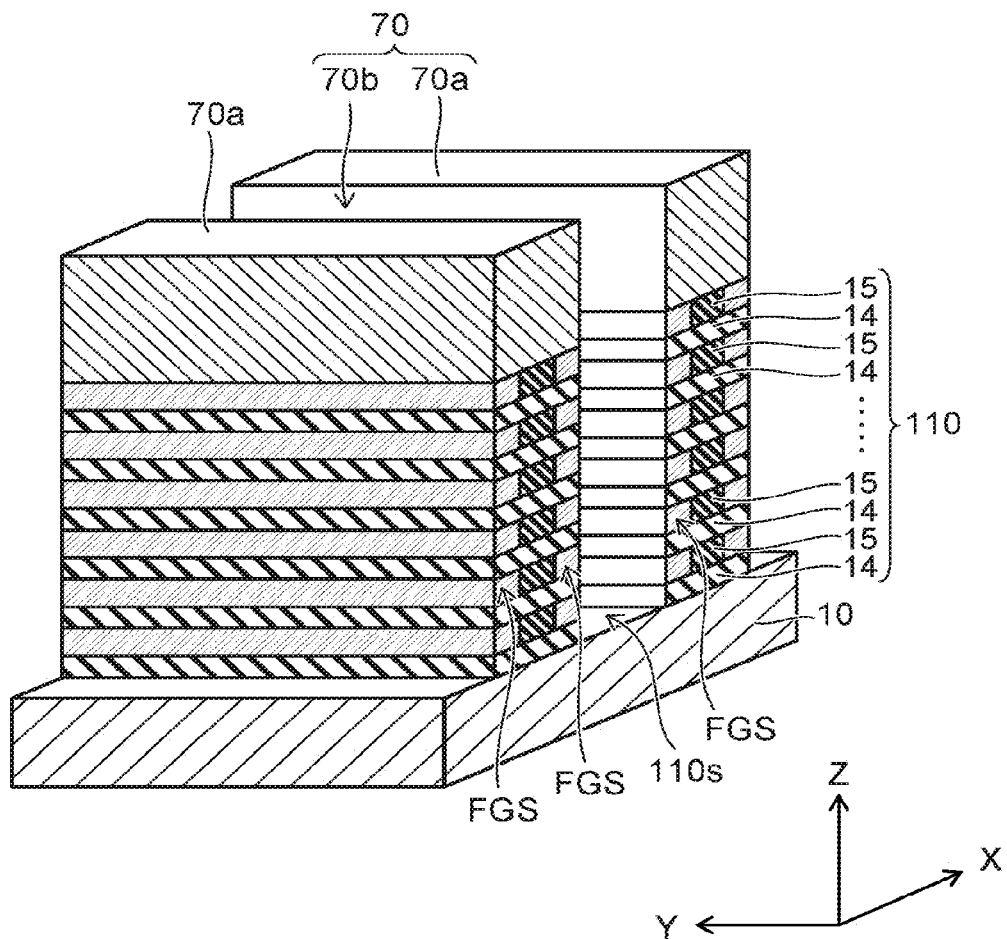
FIGS. 5A to 5C are perspective views showing a manufacturing process of a semiconductor device according to an second embodiment.
Figure 5B:
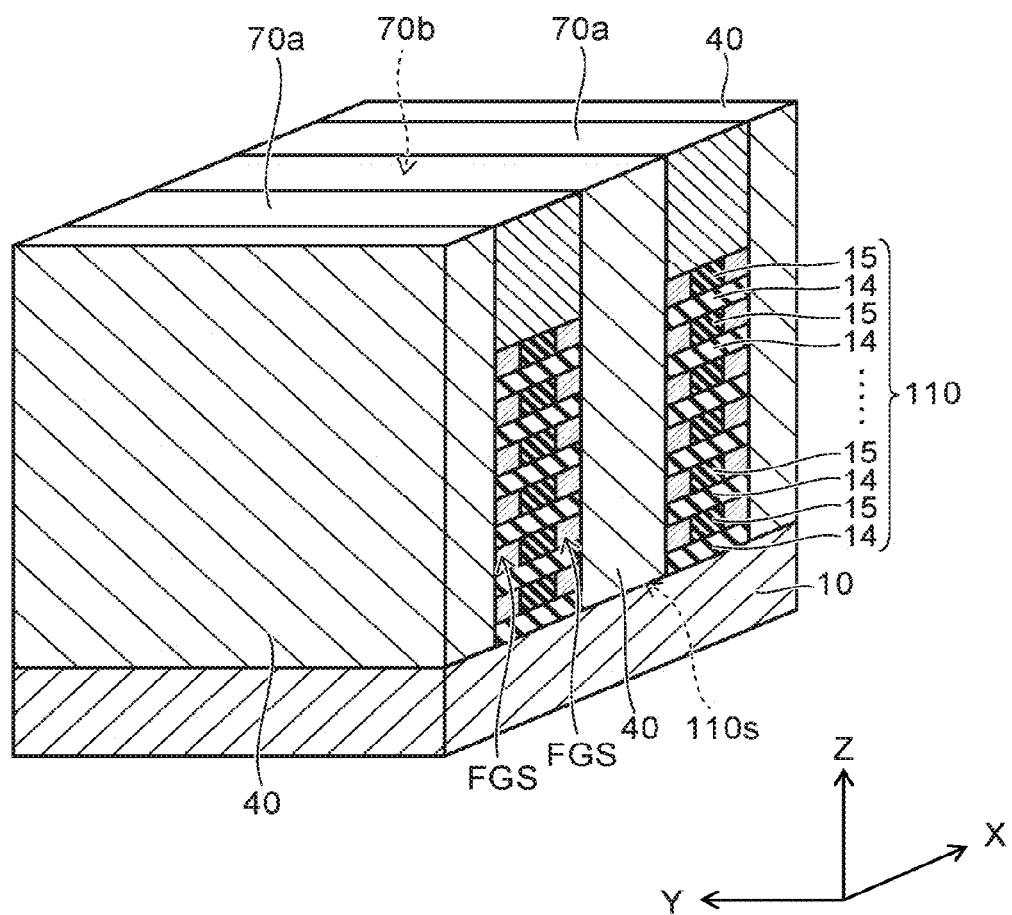
Figure 5C:
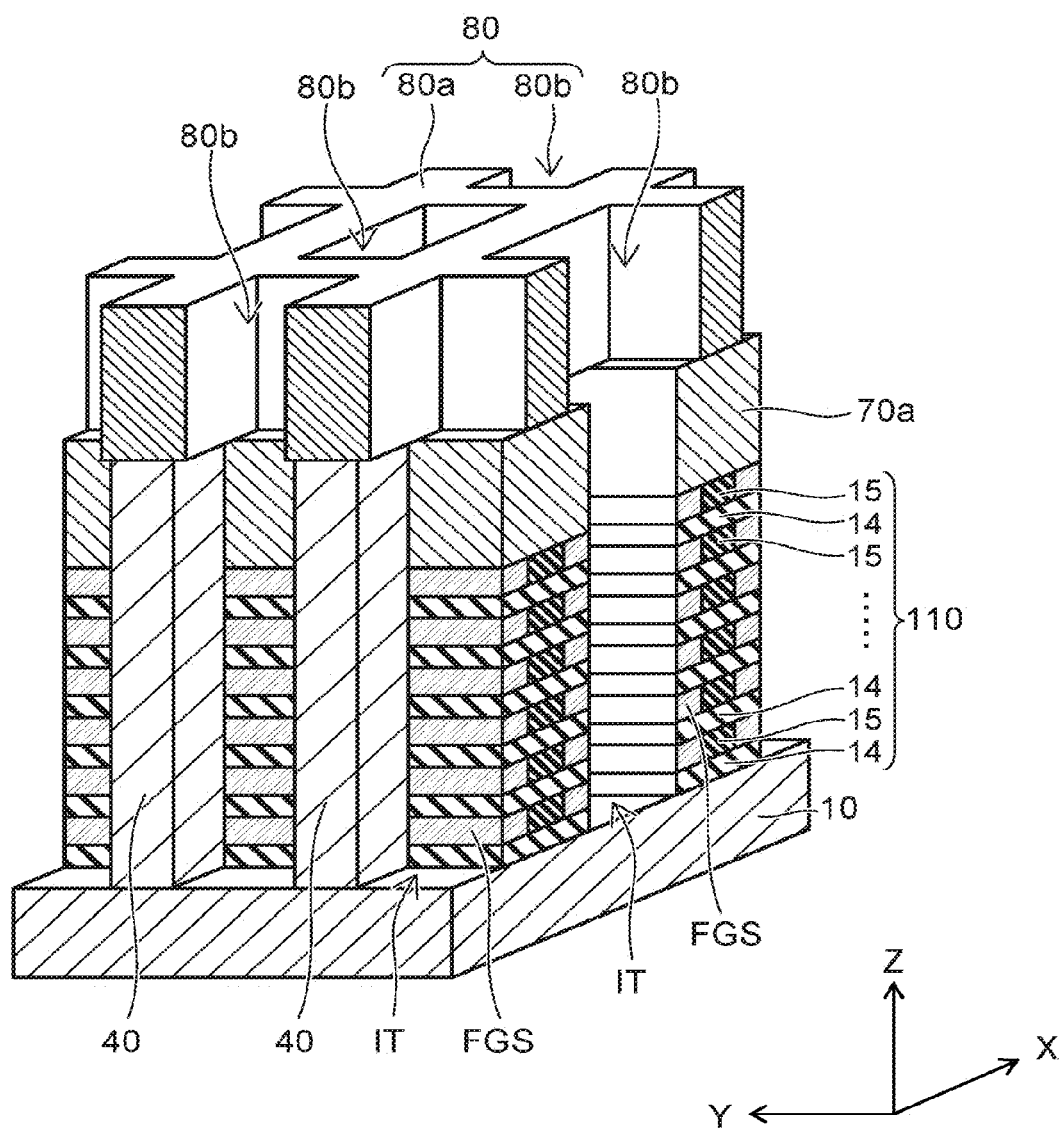

A method for manufacturing the semiconductor device 1 according to the second embodiment will now be described with reference to FIGS. 5A to 5C. FIGS. 5A to 5C are perspective views schematically showing the manufacturing processes of the semiconductor device 1 according to the second embodiment.

As shown in FIG. 5A, the stacked body 110 that is formed on the conductive layer 10 is selectively removed using the first mask layer 70. The first mask layer 70 is, for example, a silicon oxide layer formed using CVD using TEOS as a source material. Thereby, the space 110s is formed in the stacked body 110. In such a case, the hard mask layer 75 for forming the openings 70b in the first mask layer 70 (referring to FIG. 3B) includes, for example, a carbon layer formed by CVD.

Further, multiple recesses are formed in the side wall of the stacked body 110 by selectively removing portions of the insulating layers 15 exposed at the space 110s. Then, a floating gate structure FGS is formed at each of the multiple recesses. The floating gate structure FGS includes the tunneling insulating layer 21, the floating gate FG, and the first layer 23a of the blocking insulating layer 23 (referring to FIG. 2A).

As shown in FIG. 5B, a semiconductor layer 40 is formed which is embedded into the space 110s and the openings 70b of the first mask layer 70. The semiconductor layer 40 is, for example, a polysilicon layer formed using CVD.

As shown in FIG. 5C, the second mask layer 80 is formed on the semiconductor layer 40 and the shielding portion 70a of the first mask layer 70. The second mask layer 80 is, for example, a silicon oxide layer formed using CVD using TEOS as a source material. In such a case, the hard mask layer 85 for forming the openings 80b in the second mask layer 80 (referring to FIG. 3F) includes, for example, a carbon layer formed by CVD. Also, the second mask layer 80 may include a carbon layer.

As shown in FIG. 5C, isolation trenches IT that communicate with the conductive layer 10 are formed by selectively removing the semiconductor layer 40 through the openings 80b of the second mask layer 80. The semiconductor layer 40 is divided into multiple column-shaped semiconductor layers extending in the Z-direction. For example, the semiconductor layer 40 is selectively removed by RIE using an etching gas including hydrogen bromide.

Then, the floating gate structure FGS that is exposed at the inner walls of the isolation trenches IT is selectively removed; and subsequently, the insulating layer 25 is formed in the isolation trenches IT. Further, the memory cell array MA is completed by forming the slit ST, replacing the insulating layers 15 with the word lines WL, and forming the bit line BL.

[Mask Patterns]

The mask patterns that are used to manufacture the semiconductor device 1 will now be described with reference to FIGS. 6A to 6D and FIGS. 7A to 7D. For example, FIGS. 6A to 6D each illustrate a pattern of the first mask used in the photolithography for forming the resist mask 77 shown in FIG. 3B. For example, FIGS. 7A to 7D each illustrate a pattern of the second mask used in the photolithography for forming the resist mask 87 shown in FIG. 3F. Although a positive mask pattern is described in the following example in which the openings are formed in the portions irradiated with light, the embodiment is not limited thereto. For example, in the case of a negative mask pattern in which the shielding portions are formed in the portions irradiated with light, the reversed pattern is used in which the light-shielding portion and the light-transmitting portion are reversed.

A mask pattern 170 shown in FIG. 6A includes multiple light-shielding portions 170a and multiple light-transmitting portions 170b. Each of the multiple light-shielding portions 170a extends in the Y-direction. The multiple light-transmitting portions 170b extend in the Y-direction between the light-shielding portions 170a adjacent to each other in the X-direction. In other words, the mask pattern 170 is a line-and-space pattern extending in the Y-direction.

A mask pattern 173 shown in FIG. 6B includes a light-shielding portion 173a and multiple light-transmitting portions 173b. The light-shielding portion 173a includes first portions 173aa and second portions 173ab. The first portions 173aa extend in the Y-direction; and the light-transmitting portions 173b are disposed to be arranged in the Y-direction between the mutually-adjacent first portions 173aa. The second portions 173ab are positioned between the light-transmitting portions 173b adjacent to each other in the Y-direction. In the mask pattern 173, the second portions 173ab are disposed to be arranged on a straight line in the X-direction.

A mask pattern 175 shown in FIG. 6C includes a light-shielding portion 175a and multiple light-transmitting portions 175b. The light-shielding portion 175a includes first portions 175aa and second portions 175ab. The first portions 175aa extend in the Y-direction; and the light-transmitting portions 175b are disposed to be arranged in the Y-direction between the mutually-adjacent first portions 175aa. The second portions 175ab are positioned between the light-transmitting portions 175b adjacent to each other in the Y-direction. In the mask pattern 175, the second portions 175ab are disposed in a staggered configuration.

A mask pattern 177 shown in FIG. 6D includes a light-shielding portion 177a and multiple light-transmitting portions 177b. For example, the light-transmitting portions 177b are provided in elliptical configurations. The light-transmitting portions 177b are disposed to be arranged in the X-direction and the Y-direction.

As shown in FIGS. 6B to 6C, a portion of the light-shielding portion may also be provided between the light-transmitting portions arranged in the Y-direction in the mask patterns that form the resist mask 77. For example, when the stacked body 110 is selectively removed (referring to FIG. 3C), it is also favorable in the first mask layer 70 to provide cross-linking portions (the second portions) between the line patterns (between the first portions) in the case where the aspect ratio of the first mask layer 70 is 10 or more. Thereby, the etching resistance of the first mask layer 70 is improved; and the desired etched configuration may be formed in the underlying layer.

A mask pattern 180 shown in FIG. 7A includes a light-shielding portion 180a and multiple light-transmitting portions 180b. The light-shielding portion 180a includes first portions 180aa and second portions 180ab. The first portions 180aa extend in the X-direction; and the light-transmitting portions 180b are disposed to be arranged in the X-direction between the mutually-adjacent first portions 180aa. The second portions 180ab are positioned between the light-transmitting portions 180b adjacent to each other in the X-direction.

As shown in FIG. 7A, for example, the mask pattern 180 is aligned with the mask pattern 170 so that the light-transmitting portions 180b cross the light-transmitting portions 170b in the X-direction. The second portions 180ab are arranged on a straight line in the Y-direction and are disposed to be positioned on the light-shielding portions 170a.

A mask pattern 183 shown in FIG. 7B includes a light-shielding portion 183a and multiple light-transmitting portions 183b. The light-shielding portion 183a includes first portions 183aa and second portions 183ab. The first portions 183aa extend in the X-direction; and the light-transmitting portions 183b are disposed to be arranged in the X-direction between the mutually-adjacent first portions 183aa. The second portions 183ab are positioned between the light-transmitting portions 183b adjacent to each other in the X-direction and are disposed to be arranged on a straight line in the Y-direction.

As shown in FIG. 7B, for example, the mask pattern 183 is aligned with the mask pattern 170 so that the light-transmitting portions 183b cross the light-transmitting portions 170b in the X-direction. The second portions 180ab are disposed to be positioned on the light-shielding portions 170a. In the example, the light-transmitting portion 183b crosses two light-transmitting portions 170b. Thus, the light-transmitting portion 183b may be provided to cross multiple light-transmitting portions 170b as long as the etching resistance of the second mask layer 80 can be ensured.

A mask pattern 185 shown in FIG. 7C includes a light-shielding portion 185a and multiple light-transmitting portions 185b. The light-shielding portion 185a includes first portions 185aa and second portions 185ab. The first portions 185aa extend in the X-direction; and the light-transmitting portions 185b are disposed to be arranged in the X-direction between the mutually-adjacent first portions 185aa. The second portions 185ab are positioned between the light-transmitting portions 185b adjacent to each other in the X-direction, and are disposed in a staggered configuration in the Y-direction.

A mask pattern 187 shown in FIG. 7D includes a light-shielding portion 187a and multiple light-transmitting portions 187b. For example, the light-transmitting portions 187b are provided in elliptical configurations and are disposed to be arranged in the X-direction. Also, the light-transmitting portions 187b are disposed in a staggered configuration in the Y-direction.

As shown in FIG. 7D, for example, the mask pattern 187 is aligned with the mask pattern 170 so that the light-transmitting portions 187b cross the light-transmitting portions 170b in the X-direction. Also, by arranging the light-transmitting portions 187b in the staggered configuration, for example, the density of the memory cells MC of the memory cell array MA can be high compared to that of the example shown in FIG. 7A.

In the embodiments recited above, an example is shown in which the shielding portion 80a that includes the first portions 80aa and the second portions 80ab is provided in the second mask layer 80, but the embodiments are not limited thereto. For example, the first mask layer 70 may be formed using the first mask having the mask patterns shown in FIGS. 6B to 6D; and the second mask layer 80 may be formed using a line-and-space pattern. In other words, in the case where the aspect ratio exceeds 10 for the first mask layer 70 and the second mask layer 80, it is preferable to form the shielding portions including the first portions and the second portions, or form the multiple openings arranged in a staggered configuration or in the X-direction and the Y-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, the method comprising:
   forming a first mask layer on an underlying layer, the first mask layer having a first shielding portion and a first opening, the first opening extending in a first direction along the underlying layer;
   forming a space in the underlying layer by selectively removing the underlying layer through the first opening;
   forming a first layer in the space and the first opening, the space and the first opening being filled with the first layer;
   forming a second mask layer on the first mask layer and on the first layer, the second mask layer having a second shielding portion and a second opening, the second opening extending along the first mask layer and the first layer in a second direction crossing the first direction, the second opening crossing the first layer; and
   selectively removing the first layer at a portion where the second opening crosses the first layer,
   at least one of the first mask layer and the second mask layer having a plurality of openings including the first opening or the second opening,
   the plurality of openings being arranged in the first mask layer along the first direction, and/or being arranged in the second mask layer along the second direction,
   the first opening having a length along the first direction longer than a width along the first direction of the second opening, the first opening having a width in the second direction narrower than a length in the second direction of the second opening.

2. The method according to claim 1, further comprising:
   forming a second layer in a space where the first layer is selectively removed, the second layer including a material different from the first layer.

3. The method according to claim 2, wherein one of the first layer and the second layer is a semiconductor layer; and the other is an insulating layer.

4. The method according to claim 1, wherein
   the first shielding portion includes a plurality of first parts extending in the first direction with a shape of stripe lines, the first opening being positioned between two adjacent first parts of the plurality of first parts, or
   the second shielding portion includes a plurality of second parts extending in the second direction with a shape of stripe lines, the second opening being positioned between two adjacent second parts of the plurality of second parts.

5. The method according to claim 1, wherein
   the at least one of the first shielding portion and the second shielding portion includes a plurality of first portions and a second portion, the plurality of first portions extending in the first direction or the second direction with a shape of stripe lines, and the second portion being positioned between mutually-adjacent openings of the plurality of openings, the second portion linking two adjacent first portions of the plurality of first portions.

6. The method according to claim 5, wherein
   the second shielding portion includes the plurality of first portions and the second portion, and the second portion overlaps a part of the first shielding portion.

7. The method according to claim 6, wherein a width in the second direction of the second portion is narrower than a width, in the second direction, of the part of the first shielding portion.

8. The method according to claim 6, wherein the second mask layer is formed to be thicker than the first mask layer in a direction from the underlying layer toward the first mask layer.

9. The method according to claim 1, wherein the first mask layer includes amorphous silicon; and the second mask layer includes carbon.

10. The method according to claim 1, wherein the first mask layer and the second mask layer include silicon oxide.

11. The method according to claim 1, wherein the first mask layer includes silicon oxide; and the second mask layer includes carbon.

12. A method for manufacturing a semiconductor device, the method comprising:
forming a first mask layer on an underlying layer, the first mask layer having a first shielding portion and a plurality of first openings extending in a first direction along the underlying layer, the plurality of first openings being arranged in the first direction;
forming spaces in the underlying layer by selectively removing the underlying layer through the plurality of first openings;
forming a plurality of first layers in the spaces and the first openings, the spaces and the first openings being filled with the plurality of first layers;
forming a second mask layer on the first mask layer and on the plurality of first layers, the second mask layer having a second shielding portion and a plurality of second openings, the plurality of second openings being arranged in a second direction crossing the first direction, a second opening of the plurality of second openings crossing a first layer of the plurality of first layers wherein the second shielding portion includes a plurality of first portions and a second portion, the plurality of first portions extending in the second direction with a shape of stripe lines, and the second portion being positioned between mutually-adjacent openings of the plurality of second openings, the second portion linking two adjacent first portion portions of the plurality of first portions; and
selectively removing the first layer at a portion where the second opening crosses the first layer.

13. The method according to claim 12, wherein
the first shielding portion includes a plurality of first parts extending in the first direction with a shape of stripe lines, a first opening of the plurality of first openings being positioned between two adjacent first parts of the plurality of first parts.

14. The method according to claim 12, wherein
the second portion overlaps a part of the first shielding portion.

15. The method according to claim 14, wherein a width in the second direction of the second portion is narrower than a width, in the second direction, of the part of the first shielding portion.

16. The method according to claim 12, further comprising:
forming a second layer in a space where the first layer is selectively removed, the second layer including a material different from the first layer.

17. The method according to claim 16, wherein one of the first layer and the second layer is a semiconductor layer; and the other is an insulating layer.

18. The method according to claim 12, wherein the second mask layer is formed to be thicker than the first mask layer in a direction from the underlying layer toward the first mask layer.

* * * * *